United States Patent
Jadidian et al.

(10) Patent No.: US 12,184,354 B2
(45) Date of Patent: *Dec. 31, 2024

(54) LOW-FREQUENCY DETECTION AND RANGING

(71) Applicant: Apple Inc., Cupertino, CA (US)

(72) Inventors: Jouya Jadidian, Los Gatos, CA (US); Sujeet Milind Patole, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/123,855

(22) Filed: Mar. 20, 2023

(65) Prior Publication Data
US 2023/0379003 A1    Nov. 23, 2023

Related U.S. Application Data

(63) Continuation of application No. 17/394,336, filed on Aug. 4, 2021, now Pat. No. 11,611,374.
(Continued)

(51) Int. Cl.
H04B 5/73      (2024.01)
H04B 5/26      (2024.01)

(52) U.S. Cl.
CPC ............... *H04B 5/73* (2024.01); *H04B 5/26* (2024.01)

(58) Field of Classification Search
CPC ...... H04B 5/0043; H04B 5/0081; H04B 5/73; H04B 5/26; H04B 5/00; H04B 5/22;
(Continued)

(56) References Cited

U.S. PATENT DOCUMENTS 9,061,641 B2    6/2015    Lamesch
11,036,318 B2   6/2021    Bokma et al.
(Continued)

FOREIGN PATENT DOCUMENTS

CN      110199480 A      9/2019
KR      20190092347      8/2019
(Continued)

OTHER PUBLICATIONS

Miller et al., "Resonant Phase Shift Technique for the Measurement of Small Changes in Grounded Capacitors", Review of Scientific Instruments, Melville, NY, Apr. 1, 1990, 61: 1267-1292. (Year: 1990).*

(Continued)

*Primary Examiner* — Angelica Perez
(74) *Attorney, Agent, or Firm* — Fish & Richardson P.C.

(57) ABSTRACT

Embodiments are disclosed for a low-frequency detection and ranging. In an embodiment, an apparatus comprises: an open electrode; an alternating current (AC) voltage source configured to supply an excitation voltage to the open electrode at an excitation frequency; a resonant circuit coupled to the open electrode, the resonant circuit configured to oscillate when an object is within a detection distance of the open electrode; one or more processors configured to: obtain time domain samples of an output voltage of the resonant circuit when the resonant circuit is oscillating; convert the time domain samples into frequency domain samples; for each frequency domain sample, determine an amplitude difference and a phase difference as compared to an amplitude and phase of the excitation voltage; and determine a material class of the object based on the amplitude difference and the phase difference.

15 Claims, 6 Drawing Sheets

Related U.S. Application Data

(60) Provisional application No. 63/061,712, filed on Aug. 5, 2020.

(58) Field of Classification Search
CPC .......... H04B 5/24; H04B 5/263; H04B 5/266; H04B 5/40; H04B 5/43; H04B 5/45; H04B 5/48; H04B 5/72; H04B 5/77; H04B 5/79; H03K 17/955; H04W 4/008; H04W 4/80; H04W 16/20; H04W 16/222; H04M 1/72412; H04M 1/7253
See application file for complete search history.

(56) References Cited

U.S. PATENT DOCUMENTS

| | | | |
|---|---|---|---|
| 11,611,374 B2 | 3/2023 | Jadodian et al. | |
| 2003/0107371 A1* | 6/2003 | Engdahl | G01N 27/72 324/233 |
| 2003/0144011 A1* | 7/2003 | Richards | G01S 13/42 455/456.5 |
| 2004/0133092 A1* | 7/2004 | Kain | H01F 17/0006 600/377 |
| 2009/0140727 A1* | 6/2009 | Rollins | G01B 7/14 324/207.16 |
| 2009/0219039 A1* | 9/2009 | Fasshauer | H03K 17/955 324/683 |
| 2015/0199042 A1 | 7/2015 | Standing et al. | |
| 2016/0285314 A1* | 9/2016 | Van Neste | H02J 50/40 |
| 2019/0339377 A1* | 11/2019 | Reimann | G01S 13/762 |
| 2020/0200892 A1* | 6/2020 | Rajab | G01S 13/753 |
| 2020/0232824 A1 | 7/2020 | Kubo | |
| 2022/0045720 A1 | 2/2022 | Jadodian et al. | |

FOREIGN PATENT DOCUMENTS

| | | | |
|---|---|---|---|
| WO | WO-2007009833 A1 * | 1/2007 | .......... G01S 13/103 |
| WO | WO 2010114165 | 10/2010 | |

OTHER PUBLICATIONS

International Preliminary Report on Patentability in International Appln. PCT/US2021/044655, mailed Feb. 16, 2023, 10 pages.

International Search Report and Written Opinion in International Appln. No. PCT/US2021/044655, dated Nov. 12, 2021, 17 pages.

Miller et al., "Resonant phase shift technique for the measurement of small changes in grounded capacitors," Review of Scientific Instruments, Melville, NY, Apr. 1, 1990, 61:1267-1272.

* cited by examiner

LOW-FREQUENCY DETECTION AND RANGING

CROSS-REFERENCE TO RELATED APPLICATION

This application is a continuation of and claims priority to U.S. patent application Ser. No. 17/394,336, filed Aug. 4, 2021, which claims priority to U.S. Provisional Patent Application No. 63/061,712, filed Aug. 5, 2020, the entire contents of each of which are incorporated herein by reference.

TECHNICAL FIELD

This disclosure relates generally to sensors for proximity detection and ranging.

BACKGROUND

Mobile devices are known to emit electromagnetic radiation that may be harmful to humans. To ensure public safety, the U.S. Federal Communication Commission (FCC) limits power density to 1 mW/cm$^2$ in the 6-100 GHz band. Accordingly, it is desirable to detect when a human is in proximity to the mobile device, so that power density can be reduced when the mobile device is proximate to a human to comply with the FCC regulations.

Many mobile devices include proximity detectors for detecting when the mobile device is near a human body part. These proximity detectors, however, have many false positive detections, consume a lot of power, have a fixed minimum detection range, require specific antenna shapes and orientations and/or are not easily adapted to other products. Moreover, many mobile devices with small form factors (e.g., smartphone, smartwatch) often do not have enough physical space available to add additional circuitry to be used solely for ranging and detection.

SUMMARY

Embodiments are disclosed for a low-frequency detection and ranging (LFDAR).

In an embodiment, an apparatus comprises: an open electrode; an alternating current (AC) voltage source configured to supply an excitation voltage to the open electrode at an excitation frequency; a resonant circuit coupled to the open electrode, the resonant circuit configured to oscillate when an object is within a detection distance of the open electrode; one or more processors configured to: obtain time domain samples of an output voltage of the resonant circuit when the resonant circuit is oscillating; convert the time domain samples into frequency domain samples; for each frequency domain sample, determine an amplitude difference and a phase difference as compared to an amplitude and phase of the excitation voltage; and determine a material class of the object based on the amplitude difference and the phase difference.

In an embodiment, a method comprises: applying an excitation voltage to an open electrode of a low-frequency detecting and ranging (LFDAR) sensor embedded in an electronic device; obtaining, using the LFDAR sensor, time domain samples of an output voltage of a resonant circuit of the LFDAR coupled to the open electrode; converting, using one or more processors of the electronic device, the time domain samples into frequency domain samples; for each frequency domain sample, determining, using the one or more processors, an amplitude difference and a phase difference as compared to an amplitude and phase of the excitation voltage; and determining, using the one or more processors, a material class of an object within a detection distance of the open electrode based on the amplitude difference and the phase difference.

In an embodiment, a method comprises: applying an excitation voltage at a particular excitation frequency to an open electrode of a low-frequency detecting and ranging (LFDAR) sensor; (a) obtaining, using the LFDAR sensor, time domain samples of an output voltage of a resonant circuit of the LFDAR coupled to the open electrode; (b) converting, using one or more processors, the time domain samples into frequency domains samples; (c) for each frequency domain sample, determining, using the one or more processors, an amplitude difference and a phase difference as compared to an amplitude and phase of the excitation voltage; (d) forming, using the one or more processors, a cluster of the amplitude differences and phase differences; (e) classifying and estimating, using the one or more processors, a range for the cluster; (f) storing, using the one or more processors, the classification and estimated range; (g) adjusting, using the one or more processors, the excitation frequency; and (h) repeating steps (a)-(g) until a specified number of excitation frequencies is exhausted.

In an embodiment, an apparatus comprises: one or more motion sensors; one or more radio frequency (RF) transmitters; a low-frequency detection and ranging (LFDAR) sensor comprising: an open electrode; an alternating current (AC) voltage source configured to supply an excitation voltage to the open electrode at an excitation frequency; a resonant circuit coupled to the open electrode; one or more processors configured to: obtain time domain samples of an output voltage of the resonant circuit; convert the time domain samples into a frequency domain samples; for each frequency domain sample, determine an amplitude difference and a phase difference as compared to an amplitude and phase of the excitation voltage; determine a material class for the object by comparing the amplitude differences and phase differences of the frequency domain samples to a plurality of previously generated material classes; and reduce electromagnetic radiation emitted by the one or more RF transmitters based on the material type and estimated range.

Other embodiments can include an apparatus, computing device and non-transitory, computer-readable storage medium.

Particular embodiments disclosed herein provide one or more of the following advantages over other detection and ranging systems (e.g., RADAR). A mobile device employing a LFDAR sensor has extreme sensitivity at close range (e.g., between 10 cm and 20 cm) with no minimum detection range. The range can be determined by defining the size of the electrode and ground and their relative placement with respect to each other. For tethered products (e.g., a smart speaker, desktop computer), the LFDAR sensor can have meters of range since the form factor is distributed. The LFDAR sensor has low power consumption. The LFDAR sensor is agnostic to frequency (10 s of KHz to 10 s of MHz), as opposed to RADAR frequencies which are fixed and tightly regulated. The LFDAR sensor is agnostic to antenna shapes and orientations and multiple existing antennas can be used as electrodes. The LFDAR sensor uses low-cost, generic electronic components and/or can repurpose existing components (e.g., an ADC, processor) in the mobile device for detection and ranging applications, and the LFDAR sensor can be easily adapted for differential design for use with small form factor products, such as a smartwatch or television remote.

The details of one or more implementations of the subject matter are set forth in the accompanying drawings and the description below. Other features, aspects and advantages of the subject matter will become apparent from the description, the drawings and the claims.

DETAILED DESCRIPTION

Example Circuits

Figure 1A:
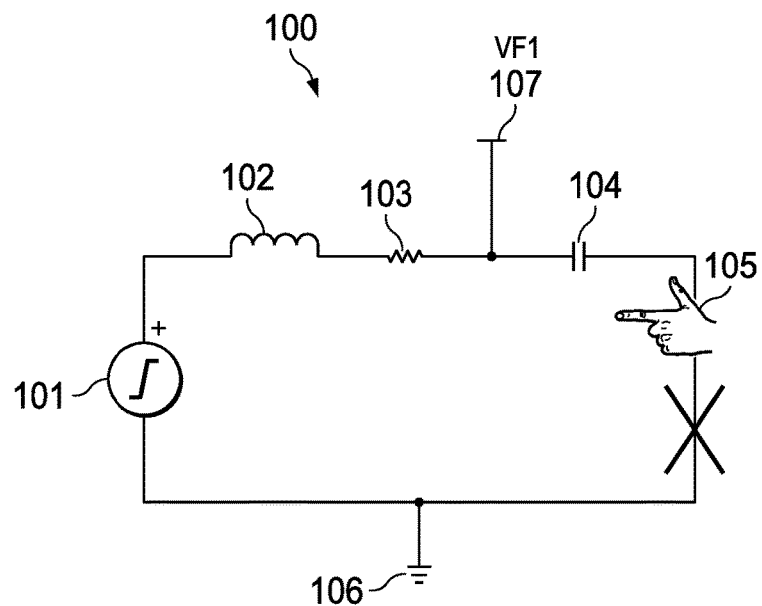
FIG. 1A is a circuit schematic diagram of an open electrode LFDAR sensor, according to an embodiment.

FIG. 1A is a circuit schematic diagram of an open electrode LFDAR sensor 100, according to an embodiment. Sensor 100 includes alternating current (AC) input voltage source 101 (VIN), inductor 102 (L1), resistor 103 (R1) and capacitor 104 (C1). Input voltage source 101 is coupled to ground 106. When capacitor 104 is capacitively coupled through human hand 105 to ground 106, sensor 100 operates as a series Resistor-Inductor-Capacitor (RLC) resonant circuit that generates an output voltage at node 107 that oscillates at a resonant frequency, $f_r$. The series RLC resonant circuit resonates based on the values of inductor 102 and resistor 103, and the combined capacitance of capacitor 104, the capacitance of hand 105 and parasitic capacitance.

Figure 1B:
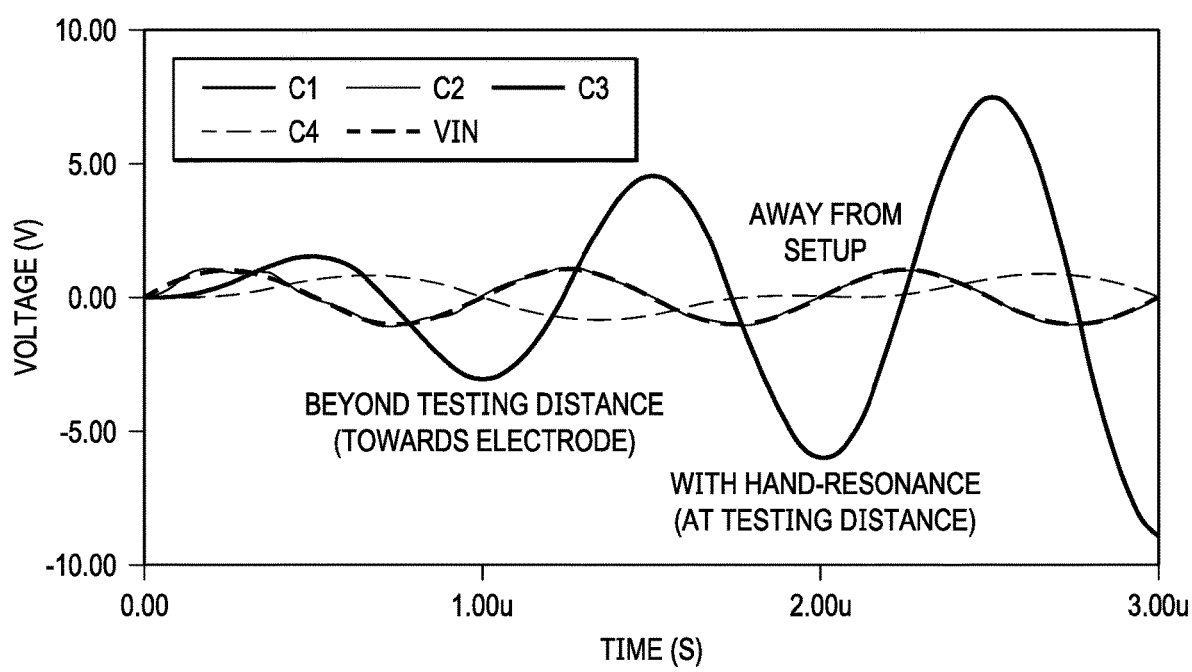
FIG. 1B is a graph illustrating an output voltage of the open electrode LFDAR sensor shown in FIG. 1A for several different material detections, in accordance with an embodiment.

FIG. 1B is a graph illustrating an output voltage of the open electrode LFDAR sensor shown in FIG. 1A for several different material detections, in accordance with an embodiment. As stated above, the presence of hand 105 in the detection range of LFDAR sensor 100 grounds the series RLC resonant circuit, causing the output voltage VF to increase in amplitude relative to the input excitation voltage (e.g., a single tone sine wave) generated by input voltage source 101. Also, the phase of the output voltage VF shifts relative to the phase of the input excitation voltage. More particularly, FIG. 1B illustrates how the resonant frequency of sensor 100 changes when hand 105 is within detection range of sensor 100, resulting in an amplitude difference and phase difference of output voltage VF that can be sampled at the output node 107. The change in amplitude and phase can be used to distinguish hand 105 from other materials (e.g., plastic, wood, water) as described below in reference to FIG. 4, to reduce false negative and false positive human proximity detections.

The output voltages VF shown in FIG. 1B are for the test cases when hand 105 is outside the detection range of sensor 100 (e.g., 10 cm), within the detection range of sensor 100 and with hand 105 pointing away from sensor 100. As can be observed, the presence of hand 105 within the detection range of sensor 100 increases in amplitude and is phase shifted compared to the input excitation voltage.

Although sensor 100 provides a high quality factor Q due to a physically very large inductor 102, such a large inductor is not practical for low-frequency detection and ranging in a mobile device, where it is desired to use existing components and to not incur additional material costs. Accordingly, an alternative LFDAR sensor 200 is described below that uses a non-inverting operational amplifier and series RLC circuit that uses a physically smaller inductor and still provides a higher quality factor Q.

Figure 2A:
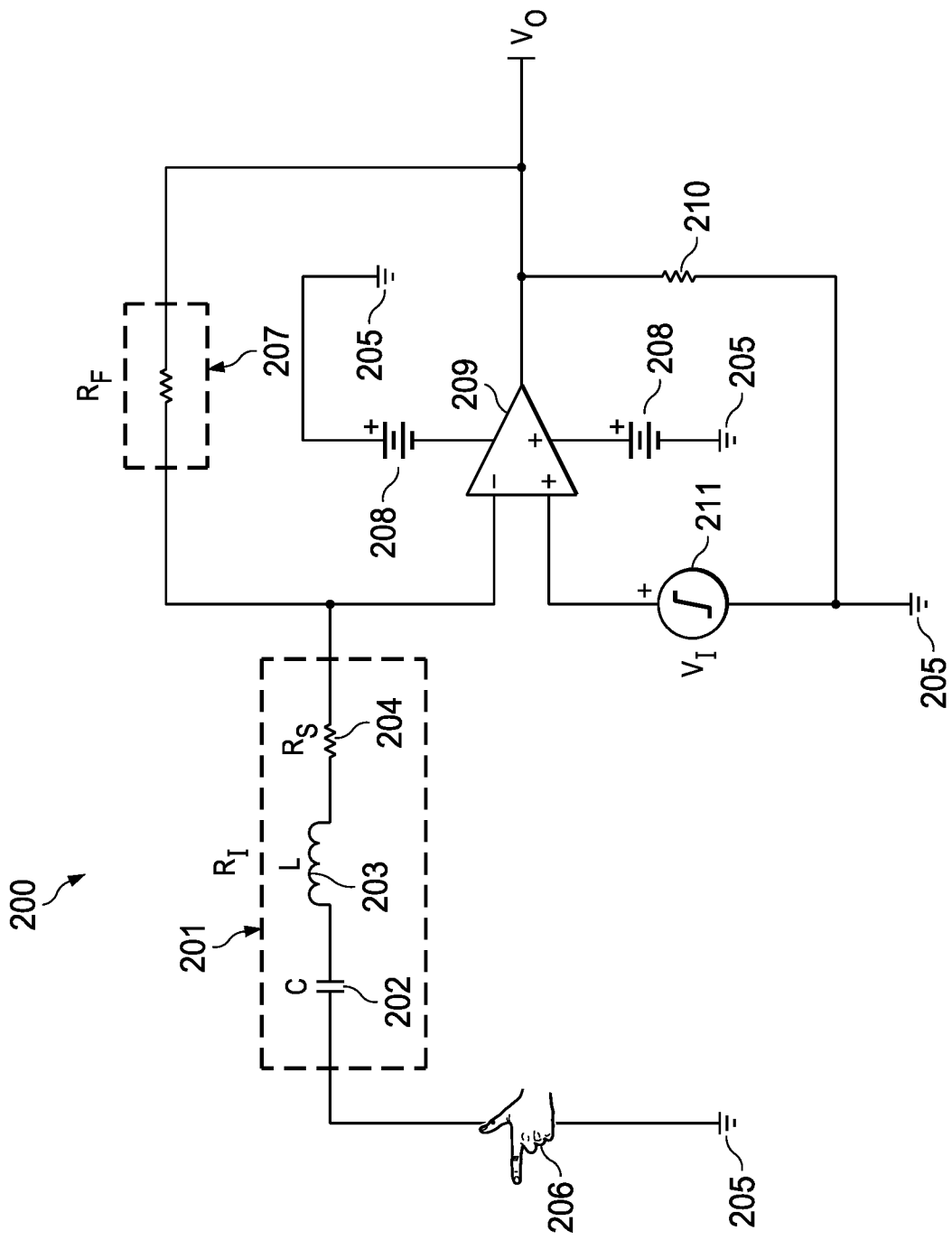
FIG. 2A is a circuit schematic diagram of a LFDAR sensor that uses a smaller inductor and provides higher resolution (higher Q) than the open electrode LFDAR sensor of FIG. 1A, according to an embodiment.

FIG. 2A is a schematic diagram of LFDAR sensor 200 that uses a small inductor and provides a higher resolution (higher Q) than provided by the open electrode LFDAR sensor of FIG. 1A, according to an embodiment. In an embodiment, sensor 200 includes non-inverting operational amplifier 209 coupled to supply voltage 208. The inverting input terminal (2) of amplifier 209 is coupled to series RLC resonant circuit 201, which includes capacitor 202 (C), inductor 203 (L) and lumped resistor 204 ($R_S$). Resistor 204 represents the lumped resistance of RLC circuit 201. The non-inverting input terminal (3) of amplifier 209 is coupled to input AC voltage source 211, which is configured in this example to generate a single tone sine wave as an excitation signal for circuit 200. Series RLC resonant circuit 201, input AC voltage source 211 and supply voltage are coupled to ground 205. Feedback resistor 207 ($R_F$) is coupled between the inverting input terminal (2) of amplifier 209 and output terminal (6) of amplifier 209. The output terminal (6) of amplifier 209 serves as an output node (VF1/$V_O$) for sensor 200. Load resistor 210 (R1) is coupled between output terminal (6) and ground 205.

The output voltage captured at output node (VF1/$V_O$) is given by Equations [1] and [2]:

$$V_o = \left(1 + \frac{R_F}{R_I}\right) \times V_I, \qquad [1]$$

$$R_I = R_S + j\omega L + \frac{1}{j\omega C}. \qquad [2]$$

LFDAR sensor 200 uses a physically small inductor (e.g., 1 mH) that provides a higher quality factor Q that improves the ability of sensor 200 to distinguish between different materials. Sensor 200 also has low power consumption and is agnostic to frequency, as opposed to RADAR frequencies which are fixed and tightly regulated. Sensor 200 is also agnostic to antenna shapes and orientations and multiple existing antennas can be used as electrodes. Sensor 200 uses low-cost, generic electronic components and/or can repurpose existing components (e.g., an ADC, processor) in the mobile device for detection and ranging applications, and the LFDAR circuit can be easily adapted for differential design for use with small form factor products, such as a smartwatch or television remote. In an embodiment, sensor 200 is included in an integrated circuit (IC) chip or system on chip (SoC).

Figure 2B:
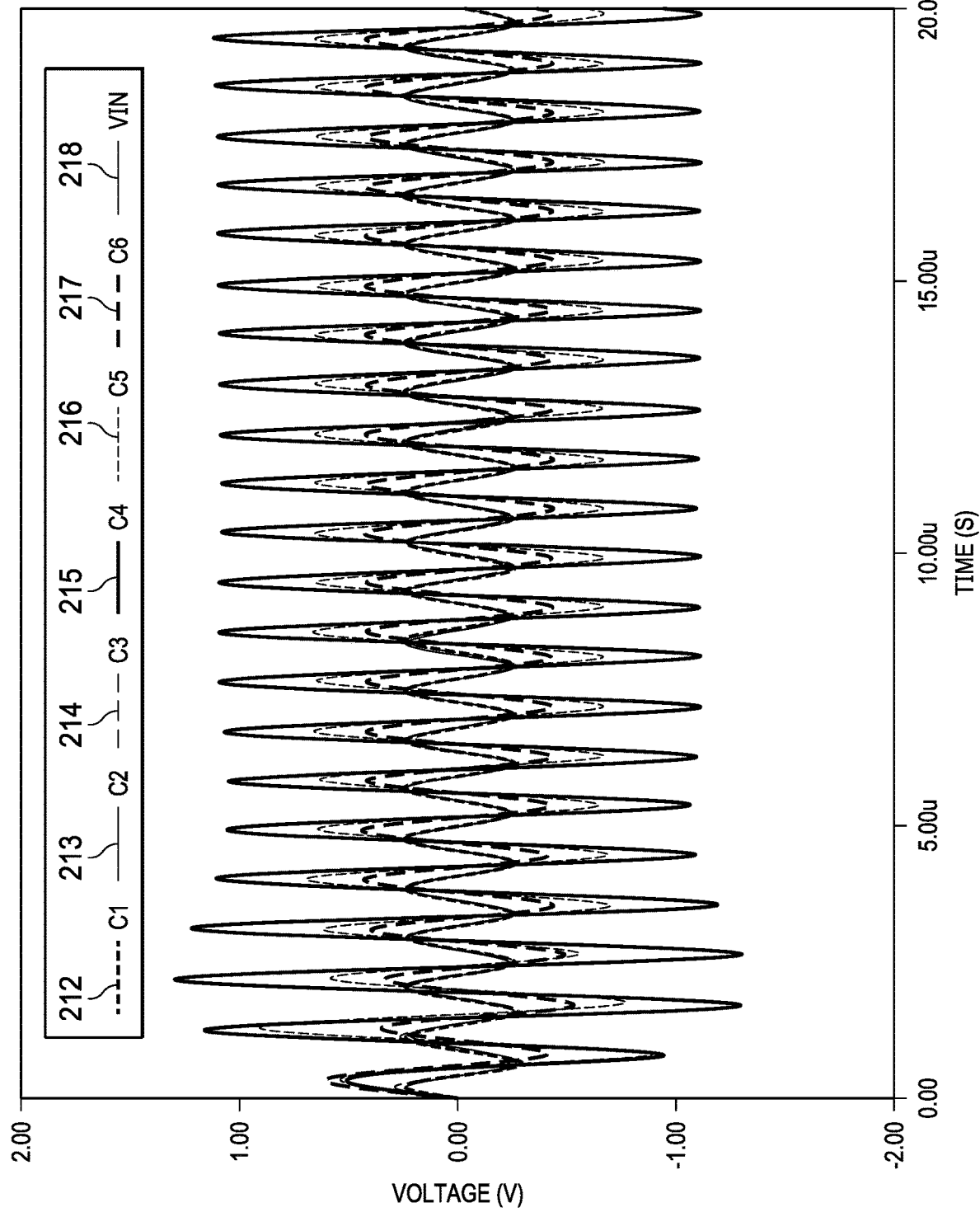
FIG. 2B is a graph illustrating an output voltage of the open electrode LFDAR sensor shown in FIG. 2A for several different material detections, in accordance with an embodiment.

FIG. 2B is a graph illustrating an output voltage of LFDAR sensor 200 shown in FIG. 2A for several different material detections, in accordance with an embodiment. The AC input voltage is plotted for comparison with different detected materials having different capacitances. As can be observed, different materials produce different amplitude and phase difference clusters, which can be exploited using LFDAR. Note that the amplitude of the output voltage changes for different types of material and range. For example, a capacitor value of 25.33 pF provides a peak-to-peak voltage swing that exceeds 1 volt.

Example Process

Figure 3:
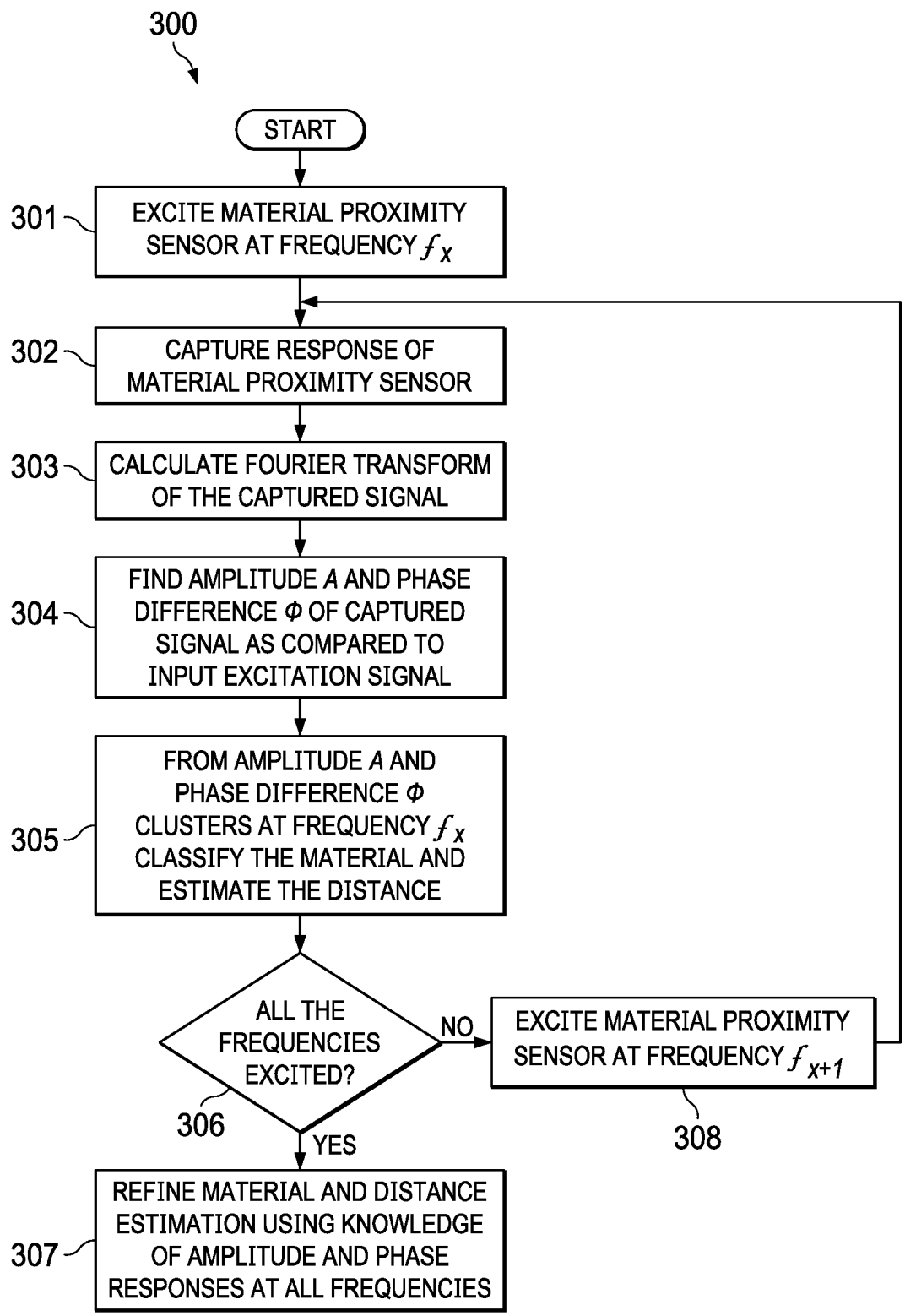
FIG. 3 is a flow diagram of an example LFDAR sensor process, according to an embodiment.

FIG. 3 is a flow diagram of an example LFDAR process 300, according to an embodiment. Process 300 can be implemented using, for example, the device architecture 500 described in reference to FIG. 5.

Process 300 begins by exciting the material proximity sensor with an input excitation signal of frequency (301). For example, a frequency adjustable single tone sine wave can be used to generate excitation signals at different excitation frequencies. Other types of period signals could also be used, such as a square wave or triangle wave.

Process 300 continues by capturing an output voltage of the material proximity sensor (302). For example, the output voltage of an output node of the LFDAR sensor 200 can be sampled using an analog-to-digital converter (ADC) to generate digital values representing the captured output voltage. In an embodiment, the ADC can be an ADC that is preexisting in the host device (e.g., an ADC in a smartphone, smart watch, TV remote, smart speaker).

Process 300 continues by calculating a frequency transform of the captured output voltage (303). For example, the digital samples output by the ADC can be input into a digital signal processor (DSP) or central processing unit (CPU) (See element 504 in FIG. 5). The DSP/CPU transforms the digital values into the frequency domain using, for example, a Fast Fourier Transform (FFT) or any other suitable transform (e.g., Discrete Cosine Transform). The output of the FFT provides an amplitude and phase at the frequency of the excitation signal. In an embodiment, the DSP/CPU can be preexisting in the host device (e.g., a smartphone, smartwatch, TV remote, smart speaker).

Process 300 continues by computing an amplitude difference $\Delta A$ and phase difference $\Delta \varphi$ of the captured output voltage by comparing these values to the amplitude and phase of the input excitation signal at the excitation frequency (304). For example, the DSP can compute the difference between the amplitude and phase of the captured output voltage and the known amplitude and phase of the excitation signal.

Process 300 continues by using the amplitude difference $\Delta A$ and phase difference $\Delta \varphi$ to classify the material and estimate the distance from the sensor (305). For example, the amplitude difference $\Delta A$ and phase difference $\Delta \varphi$ can be compared to a plurality of predetermined clusters of amplitude differences and phase differences for the excitation frequency, where each cluster is associated with a particular material at a particular frequency. The clusters can be determined empirically using any suitable clustering algorithm. In an embodiment, the amplitude and phase difference can be used to index a look-up table stored in memory of the host device to classify the material.

Process 300 continues by determining if all desired excitation frequencies have been excited (306). In accordance with all desired frequencies not being excited, changing the excitation frequency (308) and repeating the previous steps 301-306. In accordance with all desired frequencies being excited, refine the material classification and distance estimation using knowledge of the amplitude difference and phase difference at all the excitation frequencies of interest (307). For example, the average of these pairs can be used to associate the captured voltage signal with a particular cluster to classify the material and range.

In an embodiment, data can be captured offline for different materials and different ranges for each material from the sensor. For example, amplitudes and phase differences in the frequency domain can be clustered using a suitable clustering algorithm. Characteristics of the cluster (e.g., a centroid) can then be included in a database which is stored in memory of the mobile device. In an embodiment, regression analysis can be used to fit a function (e.g., a line) to the cluster of points and the resulting coefficients (e.g., slope and intercept of the line) can be stored in the database. In an embodiment, principal component analysis (PCA) can be used to characterize the cluster, which can be stored in the database. There can be multiple clusters for the same material for different ranges from the sensor and different orientations relative to the sensor at a particular excitation frequency.

During online operation, the amplitudes and phases are calculated in the frequency domain and compared to the database to find the closest matching cluster. Closest matching can be determined by comparing characteristics of the clusters using a distance metric (e.g., Euclidian distance) or method of least squares, etc. In an embodiment, the output voltage of the resonant circuit is stabilized based on motion data output by one or more motion sensors (e.g., 3-axis MEMs accelerometer, 3-axis MEMs gyro).

In an embodiment, the open electrode is an antenna coupled to an RF transmitter used for transmission and/or reception of RF signals. I.e., the antenna is used for both RF communications, provided the RF communications are at a higher frequency than the LFDAR. In an embodiment, the antenna usage can be time multiplexed so that the antenna is not used for communication and LFDAR at the same time.

In an embodiment, the excitation frequency is randomized to prevent interference with other nearby LFDARs. In an embodiment, frequency hopping can be used. In an embodiment, devices can advertise their frequency to other devices through a wireless broadcast.

In an embodiment, a minimum/maximum detection range of the LFDAR is determined by a size of the open electrode and a ground, and their relative placement with respect to each other.

In an embodiment, a minimum detection range is less than 1 centimeter.

Figure 4:
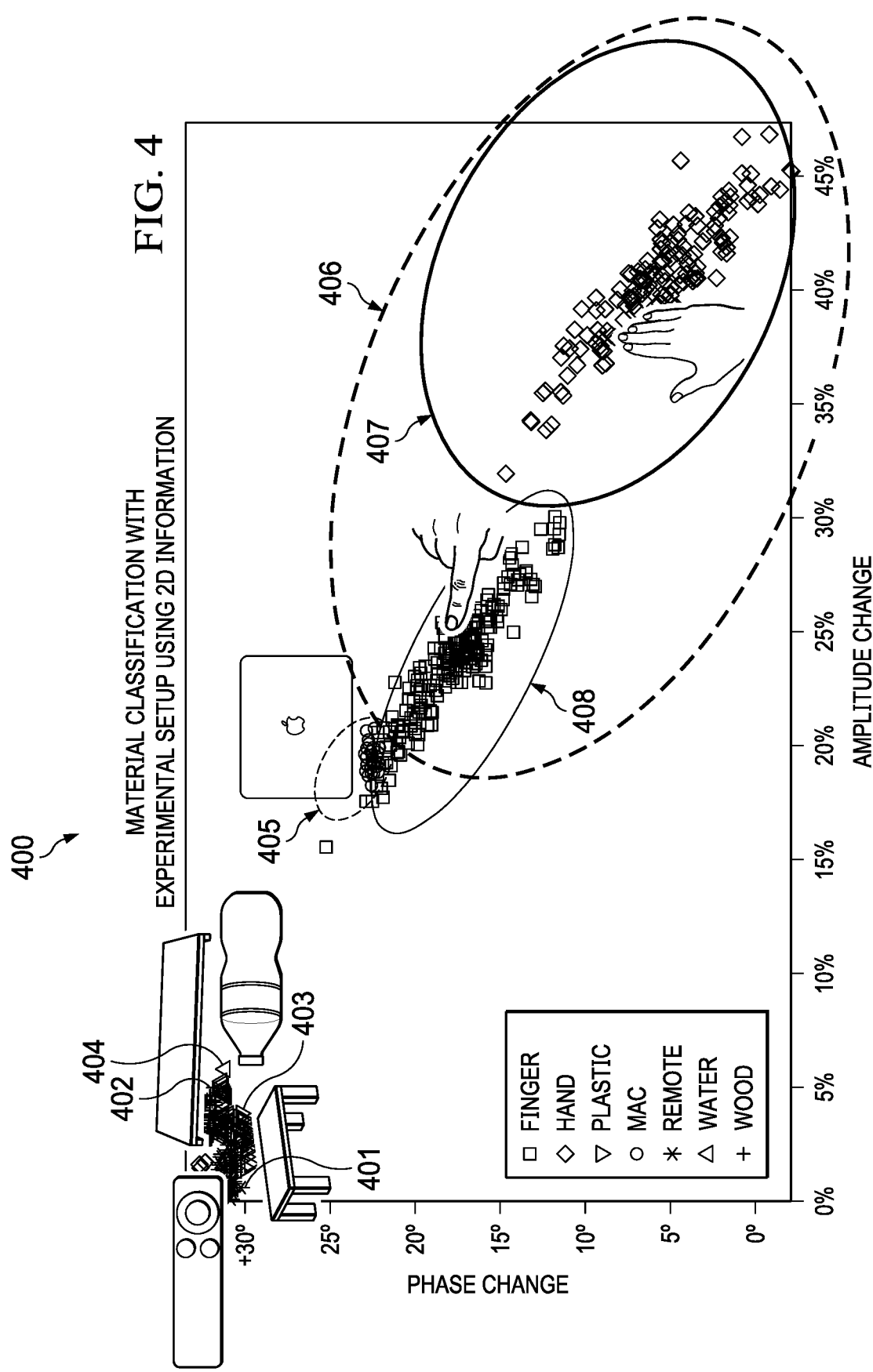
FIG. 4 is a graph illustrating the use of clusters for two-dimensional (2D) material classification using the output of the LFDAR sensor shown in FIG. 2A, according to an embodiment.

FIG. 4 is a graph of phase versus amplitude for use in material classification, according to an embodiment. As shown in FIG. 4, there are distinct clusters of amplitude and phase $(\Delta, \varphi)$ difference pairs for each excitation frequency of interest. In the example shown, there are distinct clusters for a remote 401, plastic 402, wood 403, water 404, laptop 405, finger 406 and hand 407. The finger and hand clusters 406, 407 can be joined into a single cluster 406 as a human hand class.

As can be observed from FIG. 4, cluster 406 can be distinguished from clusters associated with other materials, allowing for detection of a human hand with reduced false negatives and false positives. The clusters can be determined empirically for different types of materials and ranges. Any suitable clustering algorithm can be used, including but not limited to: hierarchical, centroid-based (e.g., k-means clustering), distribution-based, density-based (e.g., DBSCAN). For example, the centroid and extent of each cluster can be associated with its material type/range and stored in a look-up table in memory of the sensor or host device. When a new detection is occurs, the captured amplitude and phase differences are used to classify the material type/range using the clusters.

Exemplary Wearable Computer Architecture

Figure 5:
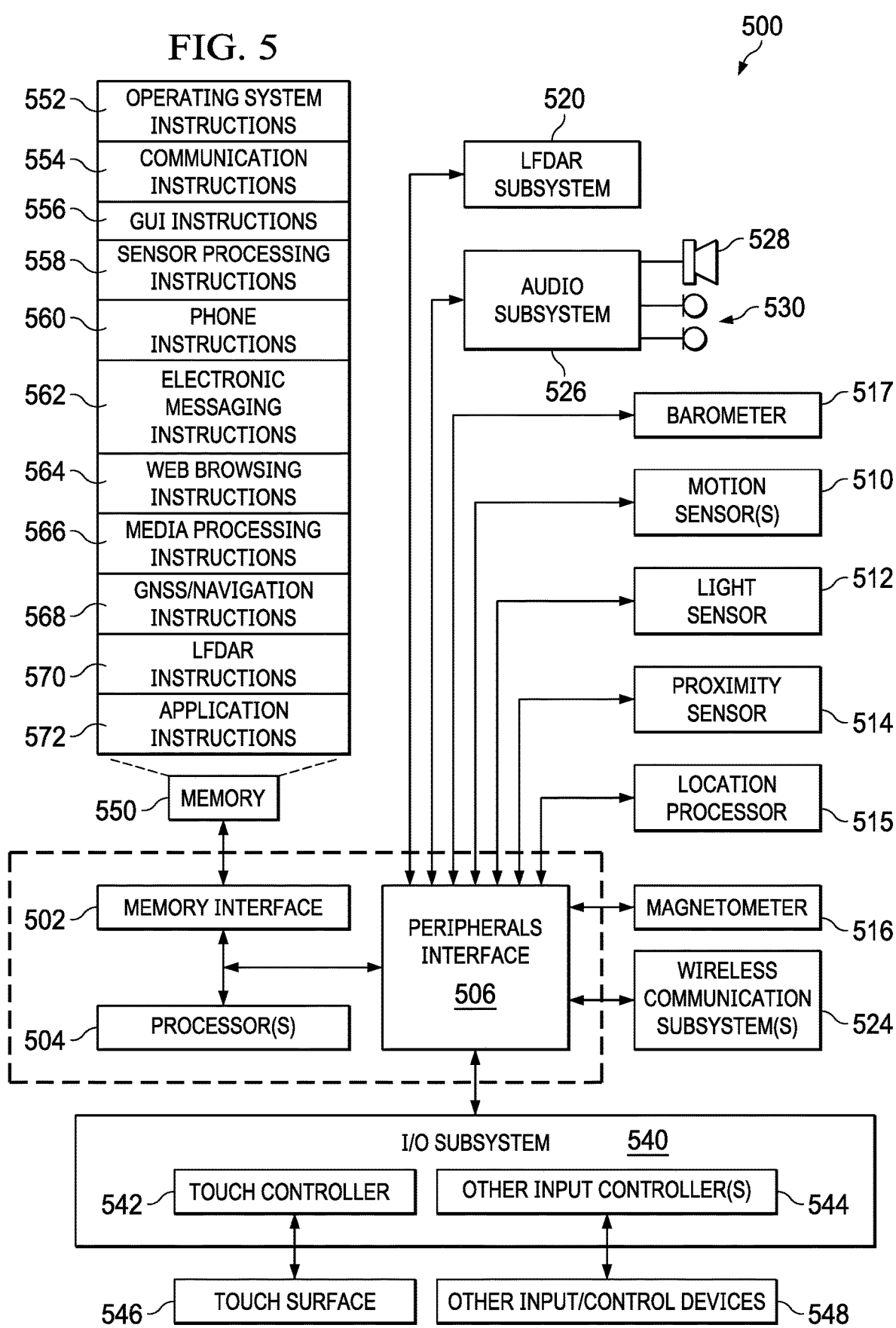
FIG. 5 is example device architecture that includes the LFDAR sensor shown in FIG. 2A and performs the LFDAR process as described in reference to FIG. 3.

FIG. 5 illustrates example device architecture 500 implementing the features and operations described in reference to FIGS. 1-5. Architecture 500 can include memory interface 502, one or more data processors, digital signal processors (DSPs), image processors and/or central processing units (CPUs) 504 and peripherals interface 506. Memory interface 502, one or more processors 504 and/or peripherals interface 506 can be separate components or can be integrated in one or more integrated circuits.

Sensors, devices and subsystems can be coupled to peripherals interface 506 to provide multiple functionalities. For example, one or more motion sensors 510, light sensor 512 and proximity sensor 514 can be coupled to peripherals interface 506 to facilitate motion sensing (e.g., acceleration, rotation rates), lighting and proximity functions of the wearable computer. Location processor 515 can be connected to peripherals interface 506 to provide geo-positioning. In some implementations, location processor 515 can be a GNSS receiver, such as the Global Positioning System (GPS) receiver. Electronic magnetometer 516 (e.g., an integrated circuit chip) can also be connected to peripherals interface 506 to provide data that can be used to determine the direction of magnetic North. Electronic magnetometer 516 can provide data to an electronic compass application. Motion sensor(s) 510 can include one or more accelerometers and/or gyros configured to determine change of speed and direction of movement of the wearable computer. Barometer 517 can be configured to measure atmospheric pressure around the mobile device.

Material proximity sensor 520 performs low-frequency detection and ranging, as described in reference to FIGS. 1-4. For example, sensor 520 can include LFDAR circuit 200, described in reference to FIG. 2 and perform the LFDAR process described in reference to FIG. 3.

Communication functions can be facilitated through wireless communication subsystems 524, which can include radio frequency (RF) receivers and transmitters (or transceivers) and/or optical (e.g., infrared) receivers and transmitters. The specific design and implementation of the communication subsystem 524 can depend on the communication network(s) over which a mobile device is intended to operate. For example, architecture 500 can include communication subsystems 524 designed to operate over a GSM network, a GPRS network, an EDGE network, a Wi-Fi™ network and a Bluetooth™ network. In particular, the wireless communication subsystems 524 can include hosting protocols, such that the mobile device can be configured as a base station for other wireless devices.

Audio subsystem 526 can be coupled to a speaker 528 and a microphone 530 to facilitate voice-enabled functions, such as voice recognition, voice replication, digital recording and telephony functions. Audio subsystem 526 can be configured to receive voice commands from the user.

I/O subsystem 540 can include touch surface controller 542 and/or other input controller(s) 544. Touch surface controller 542 can be coupled to a touch surface 546. Touch surface 546 and touch surface controller 542 can, for example, detect contact and movement or break thereof using any of a plurality of touch sensitivity technologies, including but not limited to capacitive, resistive, infrared and surface acoustic wave technologies, as well as other proximity sensor arrays or other elements for determining one or more points of contact with touch surface 546. Touch surface 546 can include, for example, a touch screen or the digital crown of a smart watch. I/O subsystem 540 can include a haptic engine or device for providing haptic feedback (e.g., vibration) in response to commands from processor 504. In an embodiment, touch surface 546 can be a pressure-sensitive surface.

Other input controller(s) 544 can be coupled to other input/control devices 548, such as one or more buttons, rocker switches, thumb-wheel, infrared port and USB port The one or more buttons (not shown) can include an up/down button for volume control of speaker 528 and/or microphone 530. Touch surface 546 or other controllers 544 (e.g., a button) can include, or be coupled to, fingerprint identification circuitry for use with a fingerprint authentication application to authenticate a user based on their fingerprint(s).

In one implementation, a pressing of the button for a first duration may disengage a lock of the touch surface 546; and a pressing of the button for a second duration that is longer than the first duration may turn power to the mobile device on or off. The user may be able to customize a functionality of one or more of the buttons. The touch surface 546 can, for example, also be used to implement virtual or soft buttons.

In some implementations, the mobile device can present recorded audio and/or video files, such as MP3, AAC and MPEG files. In some implementations, the mobile device can include the functionality of an MP3 player. Other input/output and control devices can also be used.

Memory interface 502 can be coupled to memory 550. Memory 550 can include high-speed random access memory and/or non-volatile memory, such as one or more magnetic disk storage devices, one or more optical storage devices and/or flash memory (e.g., NAND, NOR). Memory 550 can store operating system 552, such as the iOS operating system developed by Apple Inc. of Cupertino, California. Operating system 552 may include instructions for handling basic system services and for performing hardware dependent tasks. In some implementations, operating system 552 can include a kernel (e.g., UNIX kernel).

Memory 550 may also store communication instructions 554 to facilitate communicating with one or more additional devices, one or more computers and/or one or more servers, such as, for example, instructions for implementing a software stack for wired or wireless communications with other devices. Memory 550 may include graphical user interface instructions 556 to facilitate graphic user interface processing; sensor processing instructions 558 to facilitate sensor-related processing and functions; phone instructions 560 to facilitate phone-related processes and functions; electronic messaging instructions 562 to facilitate electronic-messaging related processes and functions; web browsing instructions 564 to facilitate web browsing-related processes and functions; media processing instructions 566 to facilitate media processing-related processes and functions; GNSS/Location instructions 568 to facilitate generic GNSS and location-related processes and instructions; and instructions 570 for performing the LFDAR process described in reference to FIG. 3. Memory 550 further includes application instructions 572 for performing various applications, including applications that can utilize material proximity detection and ranging, such as a power management unit for an RF transmitter or material analyzer application.

Each of the above identified instructions and applications can correspond to a set of instructions for performing one or more functions described above. These instructions need not be implemented as separate software programs, procedures, or modules. Memory 550 can include additional instructions or fewer instructions. Furthermore, various functions of the mobile device may be implemented in hardware and/or in software, including in one or more signal processing and/or application specific integrated circuits.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., SWIFT, Objective-C, C #, Java), including compiled or interpreted languages, and it can be deployed in any form, including as a stand-alone program or as a module, component, subroutine, a browser-based web application, or other unit suitable for use in a computing environment.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

What is claimed is:

1. An apparatus comprising:
    a proximity sensor including:
        a non-inverting amplifier having an inverting input terminal, a non-inverting input terminal and an output terminal;
        a feedback resistor coupled between the non-inverting input terminal and the output terminal;
        an excitation signal coupled to the inverting input terminal;
        a series resonant circuit coupled to the non-inverting input terminal, wherein the series resonant circuit includes a resistor, an inductor and a capacitor, wherein the inductor is sized to allow the series resonant circuit to self-resonate with a quality factor that provides a resolution that allows different object materials to be distinguished from one another;
        an input voltage source coupled to the inverting input of the non-inverting amplifier;
        a load resistor coupled between the output terminal and ground;
    circuitry coupled to the proximity sensor and configured to capture an output voltage of the proximity sensor in response to the proximity sensor being in proximity to an object;
    a digital signal processor coupled to the circuitry and configured to:
        compute a difference between an amplitude and phase of the captured output voltage and a stored amplitude and phase associated with the object; and
        estimate a distance of the proximity sensor from the object based on the amplitude difference and phase difference.

2. The apparatus of claim 1, wherein a minimum detection range of the proximity sensor is less than about 1 centimeter.

3. The apparatus of claim 1, wherein the inductor is about 1 mH or less.

4. The apparatus of claim 1, wherein the stored amplitude and phase are associated with an excitation frequency of the excitation signal.

5. The apparatus of claim 4, wherein the excitation signal is a single tone sine wave.

6. The apparatus of claim 4, wherein the excitation frequency is randomized.

7. An apparatus comprising:
    an antenna configured for use with transmission or reception of radio frequency signals or low-frequency detection and ranging (LFDAR);
    a radio frequency (RF) transmitter coupled to the antenna and configured to transmit or receive RF signals;
    a proximity sensor coupled to the antenna and configured to capture an output voltage of the antenna in response to the antenna being in proximity to an object,
    wherein the proximity sensor includes a non-inverting amplifier having an inverting input terminal, a non-inverting input terminal and an output terminal; a feedback resistor coupled between the non-inverting input terminal and the output terminal; an excitation signal coupled to the inverting input terminal; a series resonant circuit coupled to the non-inverting input terminal, and wherein the series resonant circuit includes a resistor, an inductor and a capacitor, wherein the inductor is sized to allow the series resonant circuit to self-resonate with a quality factor that provides a resolution that allows different object materials to be distinguished from one another, and wherein input voltage source is coupled to the inverting input of the non-inverting amplifier, and a load resistor is coupled between the output terminal and ground;
    a digital signal processor configured to:
        compute a difference between an amplitude and phase of the captured output voltage and a stored amplitude and phase associated with the object; and
        estimate a distance of the antenna from the object based on the amplitude difference and phase difference.

8. The apparatus of claim 7, wherein a minimum detection range of the proximity sensor is less than about 1 centimeter.

9. The apparatus of claim 7, wherein the inductor is about 1 mH or less.

10. The apparatus of claim 7, wherein the stored amplitude and phase are associated with an excitation frequency of the excitation signal.

11. The apparatus of claim 10, wherein the excitation signal is a single tone sine wave.

12. The apparatus of claim 11, wherein the excitation frequency is randomized.

13. The apparatus of claim 7, wherein usage of the antenna is time multiplexed so that the antenna is not used for RF communication and LFDAR at the same time.

14. The apparatus of claim 7, wherein the RF transmitter performs RF communication at a first frequency and the proximity sensor performs LFDAR at a second frequency that is lower than the first frequency.

15. The apparatus of claim 14, wherein the RF transmitter advertises the first frequency to other devices through a wireless broadcast.

\* \* \* \* \*